| (12) | United States Patent | (10) Patent No.: | US 9,136,344 B2 |
|---|---|---|---|
| | Tomabechi | (45) Date of Patent: | Sep. 15, 2015 |

(54) MANUFACTURING METHOD OF SEMICONDUCTOR DEVICE, SEMICONDUCTOR DEVICE, AND SEMICONDUCTOR CRYSTAL GROWTH SUBSTRATE

(71) Applicant: FUJITSU LIMITED, Kawasaki-shi (JP)

(72) Inventor: Shuichi Tomabechi, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 13/725,964

(22) Filed: Dec. 21, 2012

(65) Prior Publication Data

US 2013/0248932 A1      Sep. 26, 2013

(30) Foreign Application Priority Data

Mar. 26, 2012   (JP) ................. 2012-070383

(51) Int. Cl.
*H01L 21/20*      (2006.01)
*H01L 29/66*      (2006.01)
(Continued)

(52) U.S. Cl.
CPC ...... *H01L 29/66431* (2013.01); *H01L 21/0237* (2013.01); *H01L 21/0254* (2013.01); *H01L 21/02381* (2013.01); *H01L 21/02458* (2013.01); *H01L 21/02502* (2013.01); *H01L 21/02658* (2013.01); *H01L 21/304* (2013.01); *H01L 29/778* (2013.01); *H03F 1/3247* (2013.01); *H01L 21/02002* (2013.01); *H01L 24/06* (2013.01); *H01L 24/45* (2013.01); *H01L 24/49* (2013.01); *H01L 2224/05553* (2013.01); *H01L 2224/0603* (2013.01); *H01L 2224/45124* (2013.01); *H01L 2224/48091* (2013.01); *H01L 2224/48247* (2013.01); *H01L 2224/48257* (2013.01); *H01L 2224/48472* (2013.01); *H01L 2224/4903* (2013.01); *H02M 3/33592* (2013.01); *Y02B 70/1475* (2013.01); *Y02B 70/1483* (2013.01)

(58) Field of Classification Search
CPC .............. H01L 29/2003; H01L 29/778; H01L 29/66431; H01L 29/66462; H01L 21/0254
USPC ............. 257/194, E29.249; 438/47, 285, 478
See application file for complete search history.

(56) References Cited

U.S. PATENT DOCUMENTS 7,105,857 B2 *   9/2006   Nagahama et al. ............. 257/86
7,859,020 B2    12/2010   Kikkawa et al.
(Continued)

FOREIGN PATENT DOCUMENTS

CN      1599960       3/2005
JP      2002-359256   12/2002
(Continued)

OTHER PUBLICATIONS

Korean Office Action mailed Nov. 29, 2013 for corresponding Korean Application No. 10-2012-0155345, with Partial English-language Translation.

(Continued)

*Primary Examiner* — Andy Huynh
(74) *Attorney, Agent, or Firm* — Fujitsu Patent Center

(57) ABSTRACT

A method of manufacturing a semiconductor device includes grinding a back side of a substrate; and forming a nitride semiconductor layer on a front side of the substrate after the grinding. Compressive stress is generated in the nitride semiconductor layer that is formed.

11 Claims, 8 Drawing Sheets

(51) Int. Cl.
*H01L 21/02* (2006.01)
*H01L 29/778* (2006.01)
*H03F 1/32* (2006.01)
*H01L 21/304* (2006.01)
*H02M 3/335* (2006.01)
*H01L 23/00* (2006.01)

(56) References Cited

U.S. PATENT DOCUMENTS

| | | | |
|---|---|---|---|
| 8,129,748 B2 | 3/2012 | Uemoto et al. | |
| 2003/0102482 A1 | 6/2003 | Saxler | |
| 2005/0104082 A1* | 5/2005 | Oshima | 257/103 |
| 2006/0121682 A1 | 6/2006 | Saxler | |
| 2011/0140118 A1 | 6/2011 | Ramdani | |
| 2014/0295651 A1 | 10/2014 | Ramdani | |

FOREIGN PATENT DOCUMENTS

| | | |
|---|---|---|
| JP | 2008-98434 | 4/2008 |
| JP | 2009-94335 A | 4/2009 |
| KR | 10-2009-0023110 A | 5/2009 |
| KR | 2009125487 A * | 12/2009 |
| KR | 10-2012-0008141 A | 1/2012 |
| TW | 200301016 | 6/2003 |
| TW | M298776 | 10/2006 |
| TW | 201131618 | 9/2011 |
| TW | 201141984 | 12/2011 |

OTHER PUBLICATIONS

TWOA—Office Action dated Nov. 10, 2014 issued with respect to the corresponding R.O.C. Patent Application No. 101150062, with partial translation.

TWOA—Office Action dated Apr. 27, 2015 issued with respect to the corresponding Taiwan (R.O.C) Patent Application No. 101150062, with full English translation.

Please note that reference JP2009-94335 cited in the TWOA was previously submitted in the IDS filed on Jan. 24, 2014 and considered by Examiner on Apr. 10, 2014. The remainder references cited in the TWOA were previously submitted in the IDS filed on Feb. 2, 2015 and considered by Examiner on Mar. 17, 2015.

Kuei-Ming Chen, et al., "Method for modulating the wafer bow of free-standing GaN substrates via inductively coupled plasma etching"; Journal of Crystal Growth; Sep. 24, 2010; pp. 3574-3578; vol. 312; Issue 24; Elsevier B.V.

Zhou Hai, et al., "Macro quality control on ultra-precision machining of substrates"; Machinery Design & Manufacture; No. 9; Sep. 30, 2010; pp. 259-261; China Academic Journal Electronic Publishing House.

CNOA-Office Action dated Jun. 17, 2015 issued with respect to the corresponding Chinese Patent Application No. 201210587265.7, with full English translation.

* cited by examiner

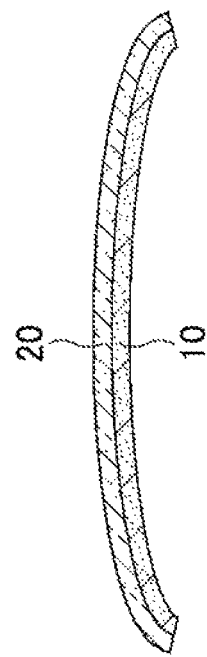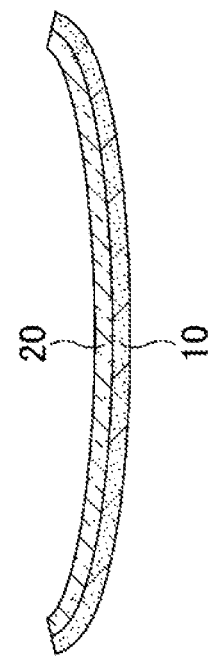

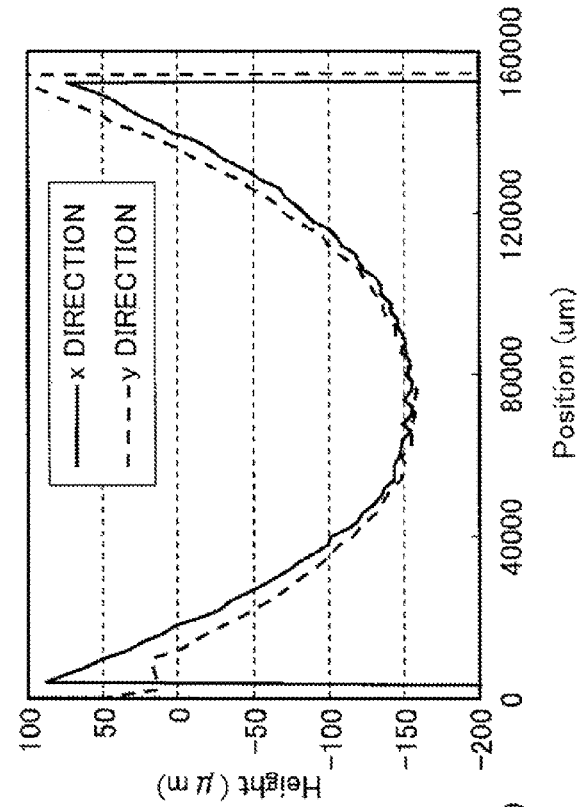
FIG. 3A  BEFORE GRINDING
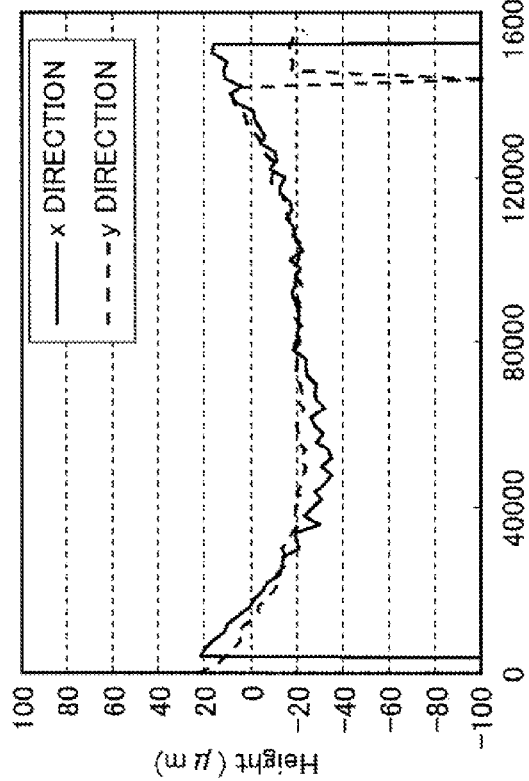
FIG. 3B  AFTER GRINDING

US 9,136,344 B2

MANUFACTURING METHOD OF SEMICONDUCTOR DEVICE, SEMICONDUCTOR DEVICE, AND SEMICONDUCTOR CRYSTAL GROWTH SUBSTRATE

CROSS-REFERENCE TO RELATED APPLICATION

This patent application is based upon and claims the benefit of priority of the prior Japanese Patent Application No. 2012-070383 filed on Mar. 26, 2012, the entire contents of which are incorporated herein by reference.

FIELD

The embodiments discussed herein are related to a manufacturing method of a semiconductor device, a semiconductor device, and a semiconductor crystal growth substrate.

BACKGROUND

GaN, AlN, InN, which are nitride semiconductors, or materials made of mixed crystals thereof, have a wide band gap, and are used as high output electronic devices or short-wavelength light emitting devices. Among these, as high output devices, technologies are developed in relation to Field effect transistors (FET), more particularly, High Electron Mobility Transistors (HEMT) (see, for example, patent document 1). A HEMT using such a nitride semiconductor is used for high output/high efficiency amplifiers and high power switching devices.

Specifically, a HEMT using a nitride semiconductor includes an AlGaN/GaN (aluminum gallium nitride/gallium nitride) hetero structure formed on a substrate, and the GaN layer is used as an electron transit layer. The substrate is usually made of sapphire, SiC (silicon carbide), GaN (gallium nitride), and Si (silicon).

GaN, which is one kind of a nitride semiconductor, has a high saturated electron speed, a wide band gap, high breakdown voltage, and good electrical characteristics. Furthermore, GaN has a polarity in a (0001) direction parallel to a c axis (wurtzite form). Thus, when an AlGaN/GaN hetero structure is formed, due to lattice distortion caused by the difference in the lattice constant between AlGaN and GaN, piezo polarization is induced, and high-density 2DEG (Two-Dimensional Electron Gas) is generated near the interface in the GaN layer.

Patent document 1: Japanese Laid-Open Patent Publication No. 2002-359256
Patent document 2: Japanese Laid-Open Patent Publication No. 2008-98434

Incidentally, when a nitride semiconductor layer including an AlGaN layer and a GaN layer is caused to epitaxially grow on a substrate made of Si or sapphire by a MOCVD (Metal Organic Chemical Vapor Deposition) method, a warpage is generated in the substrate on which films are formed. This kind of warpage in a substrate is considered to be generated due to stress in the formed semiconductor layer due to the difference in the lattice constants between the material forming the substrate and the material forming the semiconductor layer, and the difference in the thermal expansion coefficients between the material forming the substrate and the material forming the semiconductor layer.

As described above, if a warpage is formed in the substrate when a semiconductor layer is caused to epitaxially grow on the substrate, in subsequent procedures, for example, applying resist and forming an electrode, the following problem arises. That is, the substrate is not properly adsorbed, and it is not possible to convey the substrate. Furthermore, if a warpage is generated in the substrate, when exposure is performed with an exposing device, the pattern fluctuates, and exposure is not performed with a desirable precision. Accordingly, failures are caused in the process of manufacturing a semiconductor device, and the yield of semiconductor devices is reduced.

SUMMARY

According to an aspect of the embodiments, a method of manufacturing a semiconductor device includes grinding a back side of a substrate; and forming a nitride semiconductor layer on a front side of the substrate after the grinding, wherein compressive stress is generated in the nitride semiconductor layer that is formed.

The object and advantages of the invention will be realized and attained by means of the elements and combinations particularly pointed out in the appended claims. It is to be understood that both the foregoing general description and the following detailed description are exemplary and explanatory and are not restrictive of the invention as claimed.

BRIEF DESCRIPTION OF THE DRAWINGS

FIGS. 1A and 1B illustrate the relationship between film stress, crystalline properties, and device characteristics;
FIGS. 3A and 3B illustrate changes on the front side of a substrate caused by grinding the back side of the substrate.

DESCRIPTION OF EMBODIMENTS

Figure 2:
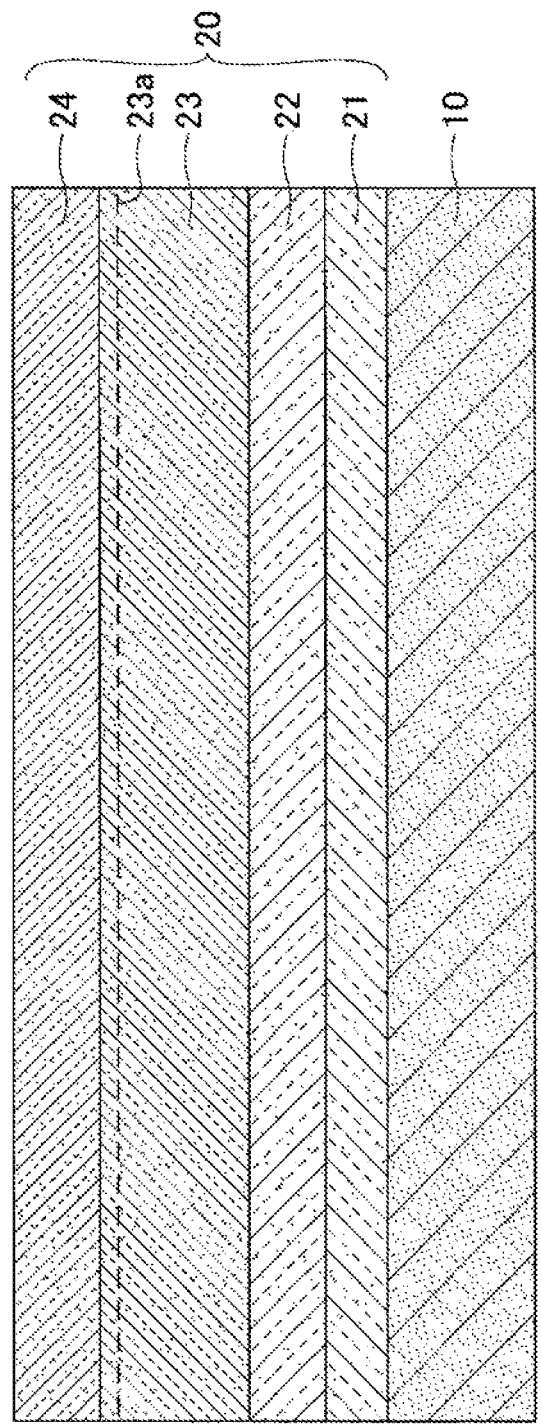
FIG. 2 illustrates a semiconductor device according to a first embodiment.

Preferred embodiments of the present invention will be explained with reference to accompanying drawings. The same elements are denoted by the same reference numerals and overlapping descriptions are omitted.

First Embodiment

In a case where a nitride semiconductor layer 20 is caused to epitaxially grow on the surface of a substrate 10 made of Si, etc., by MOCVD, as illustrated in FIGS. 1A and 1B, there is a case where compressive stress is generated in the nitride semiconductor layer 20 and a case where tensile stress is generated in the nitride semiconductor layer 20. The compressive stress or tensile stress generated in the nitride semiconductor layer 20 is generated depending on film forming conditions of MOCVD. As compressive stress or tensile stress is generated in the nitride semiconductor layer 20, a warpage is generated in the substrate 10.

When stress is generated in the nitride semiconductor layer 20, the crystallinity and the electrical characteristics (device characteristics) when fabricating HEMT are better in the case where compressive stress is generated as illustrated in FIG. 1B, than the case where tensile stress is generated as illustrated in FIG. 1A. That is to say, it is known that when the nitride semiconductor layer 20 is caused to epitaxially grow on the substrate 10, the crystallinity is better and the electrical characteristics of the fabricated HEMT is better in the case where compressive stress is generated in the nitride semiconductor layer 20, rather than tensile stress.

Furthermore, when HEMT is fabricated with the use of the substrate 10 made of Si, etc., as illustrated in FIG. 2, generally, the nitride semiconductor layer 20 is formed by causing a first buffer layer 21, a second buffer layer 22, an electron transit layer 23, and an electron supply layer 24 to epitaxially grow. The first buffer layer 21 is made of AlN, the second buffer layer 22 is made of AlGaN, the electron transit layer 23 is made of GaN, and the electron supply layer 24 is made of AlGaN. Accordingly, in the electron transit layer 23 near the interface between the electron transit layer 23 and the electron supply layer 24, 2DEG 23a is formed.

Figure 4:
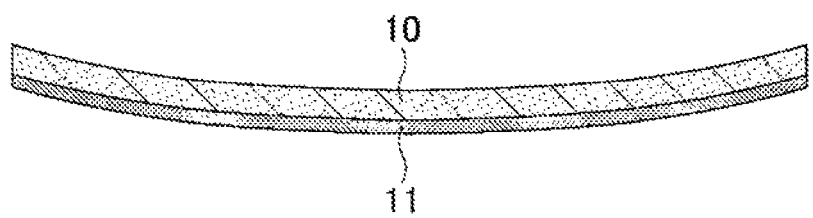
FIG. 4 schematically illustrates a change in the substrate caused by grinding the back side of the substrate.

Meanwhile, it is also known that when the back side of a substrate made of Si, etc., is ground with a grinding device, the front side of the substrate becomes recessed. Specifically, as illustrated in FIG. 3A, before the substrate is ground, the front side of the substrate is slightly recessed (a vertical interval of approximately 40 μm on the front side). The back side of this substrate is ground by approximately 20 μm through 30 μm. Accordingly, as illustrated in FIG. 3B, on the front side of the substrate, the shape of recess becomes more significant (a vertical interval of approximately 250 μm on the front side). In the case of FIGS. 3A and 3B, a semiconductor layer is formed on the surface of the substrate, and therefore the surface of the substrate is slightly recessed in the beginning. However, even in a case of grinding the back side of a flat Si substrate without a semiconductor layer, it is considered that the front side of the substrate becomes recessed. Furthermore, in the case of FIGS. 3A and 3B, the back side of the substrate is ground by 20 μm through 30 μm. However, based on experiences of the inventor, it is known that the front side of the substrate becomes recessed even if the back side of a substrate having a flat surface is ground by only 2 μm through 3 μm. That is to say, it is known that if the back side of the substrate is ground by greater than or equal to 2 μm, the front side of the substrate becomes recessed. It is considered that the front side of the substrate becomes recessed by grinding the back side of the substrate due to the following reason. Specifically, by grinding the back side of the substrate, as illustrated in FIG. 4, a fracture layer 11 is formed on the back side of the substrate 10, which is considered to cause the recess. That is to say, the grinding of the back side of the substrate 10 is performed in a state where force is applied to the back side of the substrate 10. Therefore, the part of the back side of the substrate 10 where the fracture layer 11 is formed is considered to have high density due to the force applied in the grinding process. Accordingly, compressive stress is generated in the fracture layer 11, and therefore the back side of the substrate 10 becomes protruded, which causes the front side of the substrate to become recessed. In FIGS. 3A and 3B, the substrate 10 is made of Si; however, even with a substrate made of sapphire or SiC, as long as the fracture layer 11 is formed, it is presumed that the same tendency occurs. Furthermore, an example of a grinding device for grinding the back side of the substrate is a grinder.

The above contents are known as a result of intensive research conducted by the inventor, and an embodiment of the present invention is made based on this knowledge.

Method of Manufacturing Semiconductor Device

Next, a description is given of a method of manufacturing a semiconductor device according to the present embodiment, with reference to FIGS. 5A through 5D.

Figure 5A:
FIGS. 5A through 5D illustrate a method of manufacturing a semiconductor device according to the first embodiment.

First, as illustrated in FIG. 5A, the substrate 10 is prepared. This substrate 10 has a silicon (111) surface, which is a flat surface.

Figure 5B:
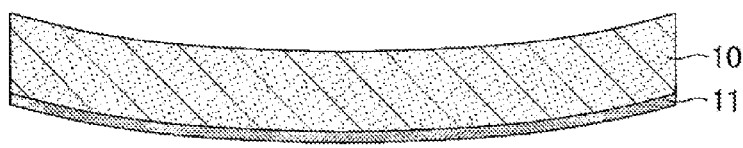

Next, as illustrated in FIG. 5B, the back side of the substrate 10 is ground by several tens of μm with a grinding device. Accordingly, on the back side of the substrate 10, the fracture layer 11 also referred to as a damage layer of approximately 10 μm is formed. As the fracture layer 11 is formed on the back side of the substrate 10, the back side of the substrate 10 deforms into a protruding shape, and accordingly, the front side of the substrate 10 deforms into a recessed shape. Subsequently, the substrate is sufficiently cleansed. Thus, a semiconductor crystal growth substrate according to the present embodiment is formed.

Figure 5C:
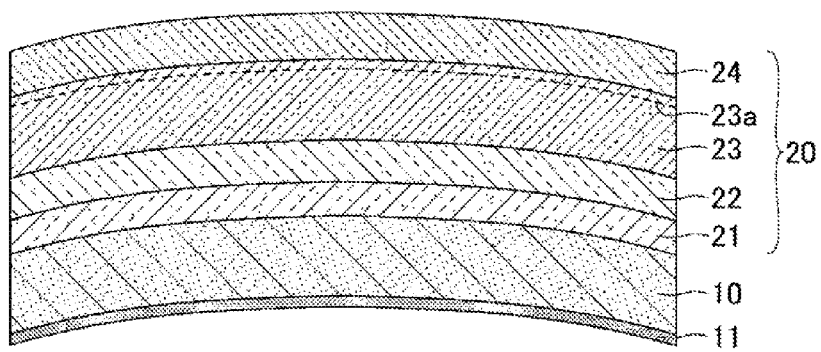

Next, as illustrated in FIG. 5C, by MOCVD, the first buffer layer 21, the second buffer layer 22, the electron transit layer 23, and the electron supply layer 24, which constitute the nitride semiconductor layer 20, are sequentially laminated by epitaxial growth on the surface of the substrate 10. The first buffer layer 21 is made of AlN, the second buffer layer 22 is made of AlGaN, the electron transit layer 23 is made of GaN, and the electron supply layer 24 is made of AlGaN. Accordingly, in the electron transit layer 23, near the interface between the electron transit layer 23 and the electron supply layer 24, the 2DEG 23a is formed.

The films are formed by epitaxial growth by MOCVD under conditions by which the front side of the substrate 10 protrudes, i.e., compressive stress is generated in the films, by forming the first buffer layer 21, the second buffer layer 22, the electron transit layer 23, and the electron supply layer 24. Accordingly, before forming films by MOCVD, the front side of the substrate 10 is recessed, but by causing the nitride semiconductor layer 20 to epitaxially grow by MOCVD, the front side of the substrate 10 becomes flat or slightly protruded. That is to say, the stress that causes the front side of the substrate 10 to become recessed by the fracture layer 11 formed by grinding, and the stress that is generated by the epitaxial growth of the nitride semiconductor layer 20 and that causes the front side of the substrate 10 to become protruded, partially cancel out each other. Therefore, the front side of the substrate 10 becomes flat or slightly protruded. This state is nearer a flat state, compared to the case of using a substrate that is flat in the beginning and forming a nitride semiconductor layer under conditions by which compressive stress is generated. As described above, in the present embodiment, the surface of the substrate 10 becomes near a flat state, and therefore it is possible to adsorb the substrate without any problem when conveying the substrate, and when exposure is performed with an exposing device, patterns are precisely formed without fluctuating. Thus, it is possible to mitigate problems from occurring in the process of manufacturing semiconductor devices, and therefore the yield of semiconductor devices is increased.

Figure 5D:
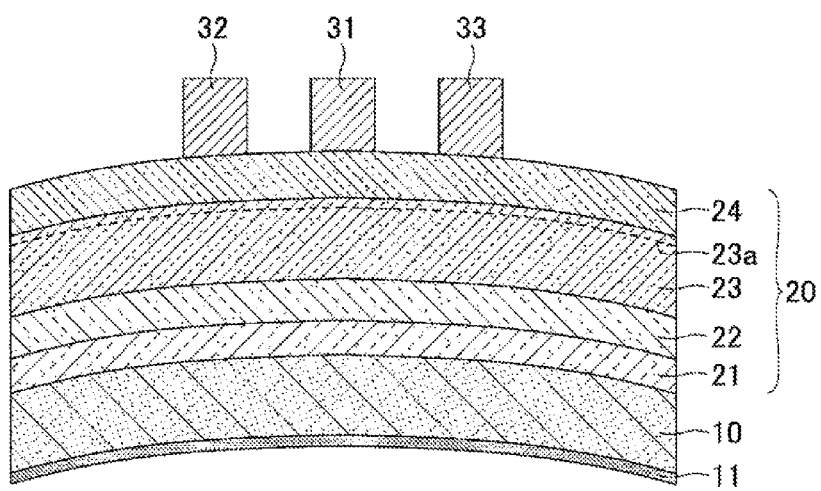

Next, as illustrated in FIG. 5D, on the electron supply layer 24, a gate electrode 31, a source electrode 32, and a drain electrode 33 are formed with a metal material, and the elements are separated with a dicing saw. Accordingly, a semiconductor device according to the present embodiment is fabricated.

In the semiconductor device manufactured by the method according to the present embodiment, compressive stress is generated in the nitride semiconductor layer 20, and therefore the electrical characteristics are good. Furthermore, the surface of the substrate 10 after forming the nitride semiconductor layer 20 is near a flat state. Therefore, the substrate may be conveyed without any problem, and patterns are prevented from fluctuating when exposure is performed. Therefore, microscopic wirings are accurately formed. Thus, the semiconductor device manufactured by the method according to the present embodiment has good electrical characteristics, and the yield is increased.

In the method described above, before forming the nitride semiconductor layer 20 by MOCVD, the back side of the substrate 10 is ground in order to make the front side of the substrate 10 have a recessed shape. However, if there is any method other than grinding of making the front side of the substrate 10 have a recessed shape, the other method may be performed to make the front side of the substrate 10 have a recessed shape. Furthermore, if it is possible to fabricate a substrate 10 having a recessed shape on the front side from the beginning by another method, the nitride semiconductor layer 20 may be formed on the front side the substrate 10 having a recessed shape from the beginning, by epitaxial growth by performing MOCVD.

Second Embodiment

Next, a description is given of a second embodiment. The present embodiment is relevant to a semiconductor device, a power unit, and a high-frequency amplifier.

Figure 6:
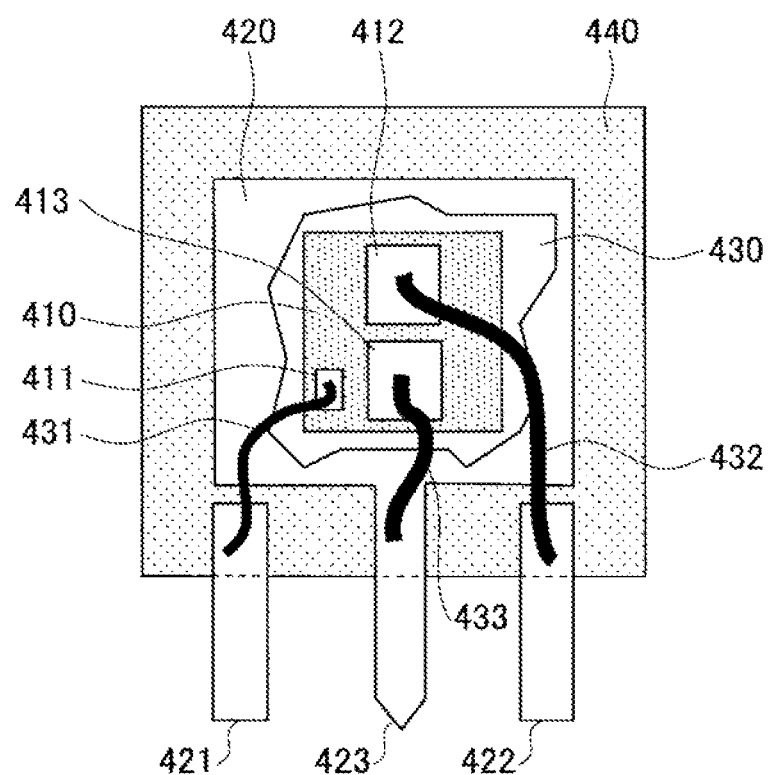
FIG. 6 schematically illustrates a discretely packaged semiconductor device according to a second embodiment.

The semiconductor device according to the present embodiment is formed by discretely packaging the semiconductor device according to the first embodiment. A description is given of this discretely packaged semiconductor device with reference to FIG. 6. FIG. 6 schematically illustrates the inside of the discretely packaged semiconductor device, and the locations of electrodes are different from those of the first embodiment.

First, the semiconductor device manufactured according to the first embodiment is cut by dicing, and a semiconductor chip 410 that is a HEMT made of a GaN system material is formed. The semiconductor chip 410 is fixed on a lead frame 420 by a diatouch agent 430 such as solder. The semiconductor chip 410 corresponds to the semiconductor device according to the first embodiment.

Next, the gate electrode 411 is connected to a gate lead 421 by a bonding wire 431, the source electrode 412 is connected to a source lead 422 by a bonding wire 432, and the drain electrode 413 is connected to a drain lead 423 by a bonding wire 433. The bonding wires 431, 432, and 433 are formed by a metal material such as Al. Furthermore, in the present embodiment, the gate electrode 411 is a gate electrode pad, which is connected to the gate electrode 31 of the semiconductor device according to the first embodiment. Furthermore, the source electrode 412 is a source electrode pad, which is connected to the source electrode 32 of the semiconductor device according to the first embodiment. Furthermore, the drain electrode 413 is a drain electrode pad, which is connected to the drain electrode 33 of the semiconductor device according to the first embodiment.

Next, resin sealing is performed with mold resin 440 by a transfer mold method. As described above, a discretely packaged semiconductor chip that is a HEMT made of a GaN system material is manufactured.

Next, a description is given of a power unit and a high-frequency amplifier according to the present embodiment. The power unit and the high-frequency amplifier according to the present embodiment use any one of the semiconductor devices according to the first embodiment.

Figure 7:
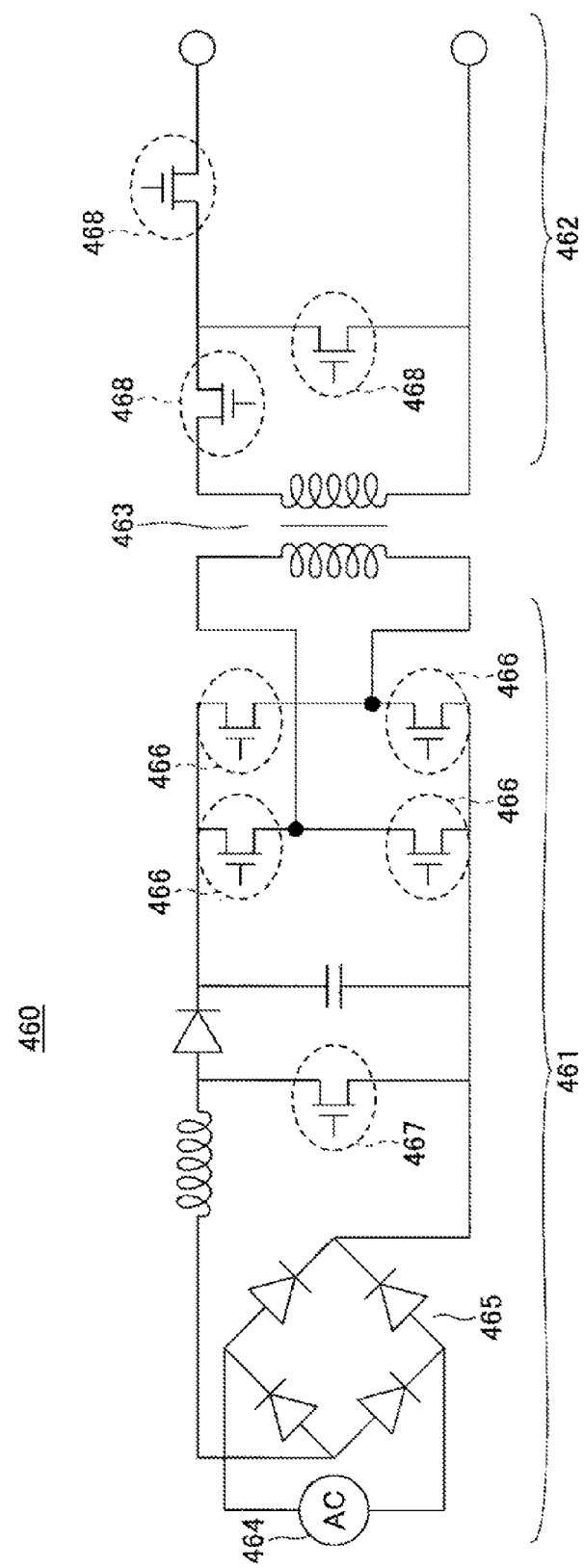
FIG. 7 illustrates a power unit according to the second embodiment.

First, with reference to FIG. 7, a description is given of the power unit according to the present embodiment. A power unit 460 according to the present embodiment includes a high voltage primary side circuit 461, a low voltage secondary side circuit 462, and a transformer 463 disposed between the high voltage primary side circuit 461 and the low voltage secondary side circuit 462. The high voltage primary side circuit 461 includes an AC (alternating-current) source 464, a so-called bridge rectifier circuit 465, plural switching elements (four in the example of FIG. 7) 466, and one switching element 467. The low voltage secondary side circuit 462 includes plural switching elements 468 (three in the example of FIG. 7). In the example of FIG. 7, the semiconductor device according to the first embodiment is used as the switching elements 466 and the switching element 467 of the high voltage primary side circuit 461. The switching elements 466 and 467 of the primary side circuit 461 are preferably normally-off semiconductor devices. Furthermore, switching elements 468 used in the low voltage secondary side circuit 462 are typical MISFET (Metal Insulator Semiconductor Field Effect Transistor) made of silicon.

Figure 8:
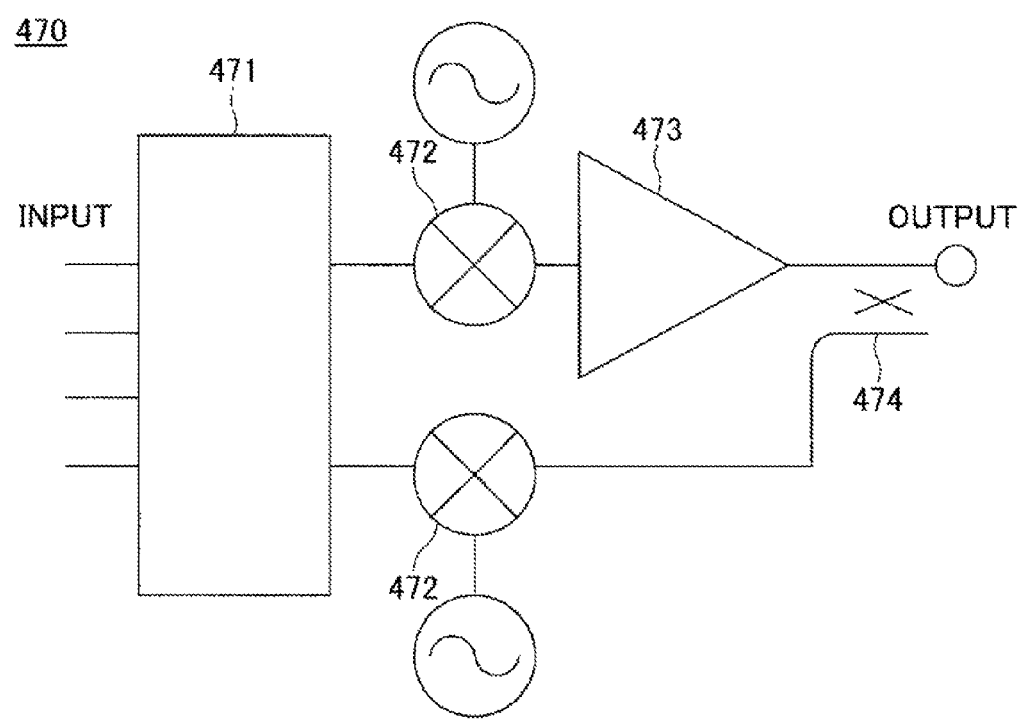
FIG. 8 illustrates a high-frequency amplifier according to the second embodiment.

Next, with reference to FIG. 8, a description is given of the high-frequency amplifier according to the present embodiment. A high-frequency amplifier 470 according to the present embodiment may be applied to a power amplifier of a base station of mobile phones. The high-frequency amplifier 470 includes a digital predistortion circuit 471, mixers 472, a power amplifier 473, and a directional coupler 474. The digital predistortion circuit 471 offsets the non-linear strains of input signals. The mixers 472 mix the input signals, whose non-linear strains have been offset, with AC signals. The power amplifier 473 amplifies the input signals that have been mixed with the AC signals. In the example of FIG. 8, the power amplifier 473 includes the semiconductor device according to the first embodiment. The directional coupler 474 monitors input signals and output signals. In the circuit of FIG. 8, for example, the switch may be switched so that output signals are mixed with AC signals by the mixers 472 and sent to the digital predistortion circuit 471.

According to an aspect of the embodiments, a manufacturing method of a semiconductor device, a semiconductor device, and a semiconductor crystal growth substrate are provided, in which a warpage in the substrate is minimized, even when a semiconductor layer is caused to epitaxially grow on the surface of a substrate by a MOCVD method. Therefore, failures in the process of manufacturing a semiconductor device are reduced, and the yield of the manufactured semiconductor devices is increased.

The present invention is not limited to the specific embodiments described herein, and variations and modifications may be made without departing from the scope of the present invention.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A method of manufacturing a semiconductor device, the method comprising:
grinding a back side of a substrate evenly; and
forming a nitride semiconductor layer on a front side of the substrate to generate a stress that causes the front side of the substrate to become protruded by performing epitaxial growth on the front side of the substrate, after the grinding,
wherein compressive stress is generated in the nitride semiconductor layer that is formed, and
wherein the back side of the substrate is formed to have an evenly ground surface whereas the front side of the substrate is formed to maintain the protruded state.

2. The method according to claim 1, wherein
the grinding includes grinding the substrate that is a silicon substrate, a sapphire substrate, or a SiC substrate.

3. The method according to claim 1, wherein
the grinding includes grinding the substrate that is a silicon (111) surface substrate.

4. The method according to claim 1, wherein
the grinding includes grinding the back side of the substrate by greater than or equal to 2 pm.

5. The method according to claim 1, wherein
the grinding includes grinding the back side of the substrate with a scribe device.

6. The method according to claim 1, wherein
the forming includes forming the nitride semiconductor layer by MOCVD (Metal Organic Chemical Vapor Deposition).

7. The method according to claim 1, wherein
the forming includes forming the nitride semiconductor layer by sequentially laminating a buffer layer, an electron transit layer, and an electron supply layer.

8. The method according to claim 7, wherein
the forming includes forming the buffer layer including a first buffer layer and a second buffer layer, and the first buffer layer and the second buffer layer being sequentially formed in the stated order on the substrate, wherein
the forming includes forming the first buffer layer made of a material including AlN, and
the forming includes forming the second buffer layer made of a material including AlGaN.

9. The method according to claim 7, wherein
the forming includes forming the electron transit layer made of a material including GaN.

10. The method according to claim 7, wherein
the forming includes forming the electron supply layer made of a material including AlGaN.

11. The method according to claim 7, further comprising:
forming a gate electrode, a source electrode, and a drain electrode on the electron supply layer, after the forming of the nitride semiconductor layer.

* * * * *